United States Patent [19]

Tiedje et al.

[11] Patent Number: 4,514,582

[45] Date of Patent: Apr. 30, 1985

[54] OPTICAL ABSORPTION ENHANCEMENT IN AMORPHOUS SILICON DEPOSITED ON ROUGH SUBSTRATE

[75] Inventors: Thomas Tiedje, Garwood; Benjamin Abeles, Princeton, both of N.J.

[73] Assignee: Exxon Research and Engineering Co., Florham Park, N.J.

[21] Appl. No.: 585,546

[22] Filed: Mar. 2, 1984

Related U.S. Application Data

[63] Continuation of Ser. No. 419,158, Sep. 17, 1982, abandoned.

[51] Int. Cl.³ .................. H01L 31/04; H01L 31/18
[52] U.S. Cl. .................. 136/256; 136/258; 136/259; 29/572; 29/580; 204/192 S; 357/2; 357/30; 427/39; 427/74; 427/86; 427/290
[58] Field of Search ........... 29/572, 580; 427/39, 427/74, 86, 290; 136/256, 258 PC, 258 AM, 259; 357/2, 30; 204/192 S; 428/612, 620, 687

[56] References Cited

U.S. PATENT DOCUMENTS

| 2,688,564 | 9/1954 | Forgue | 427/74 |
| 4,116,718 | 9/1978 | Yerkes et al. | 136/246 |
| 4,377,723 | 3/1983 | Dalal | 136/249 |
| 4,419,533 | 12/1983 | Czubatyj et al. | 136/259 |

FOREIGN PATENT DOCUMENTS

| 56-152276 | 11/1981 | Japan | 136/258 AM |
| 57-49278 | 3/1982 | Japan | 136/259 |

Primary Examiner—Aaron Weisstuch
Attorney, Agent, or Firm—Ronald D. Hantman

[57] ABSTRACT

A thin film semiconductor device with enhanced optical absorption properties and a method for producing it. The device comprises a substrate having at least one sandblasted surface and a thin film of semiconductor material deposited on the sandblasted surface.

11 Claims, 4 Drawing Figures

OPTICAL ABSORPTION ENHANCEMENT IN AMORPHOUS SILICON DEPOSITED ON ROUGH SUBSTRATE

This is continuation of application Ser. No. 419,158, filed Sept. 17, 1982, abandoned.

BACKGROUND OF THE INVENTION

The practical utility of a semi-conductor material in many electronic device applications, such as solar cells, photo detectors, xerographic photoreceptors or vidicon targets, depends on the ability of the semiconductor material to absorb light. All semiconductor materials are weakly absorbing or transparent at long wavelengths and strongly absorbing at short wavelengths. The transition from absorbing to transparent occurs at a wavelength for which the photon energy $h\nu$ is roughly equal to the band gap of the semiconductor. In direct gap crystalline semiconductors, such as GaAs for example, the transition from transparent to absorbing is abrupt, occuring over a small range of photon energy (about 0.05 ev). On the other hand, in indirect gap crystalline semiconductors, of which crystalline Si is an example, or in amorphous semiconductors such as amorphous selenium or amorphous hydrogenated silicon, the optical absorption threshold is relatively broad and the transition from transparent to absorbing occurs over a relatively broad range of wavelengths or equivalently of photon energies. In the amorphous semiconductor case, the width of the transition region is typically of the order of 0.2 ev.

In this intermediate wavelength region these semiconductor materials are not good absorbers of light. One solution for semiconductor devices in which complete absorption is needed, such as solar cells, is simply to make the semiconductor material thicker. However, this approach can have serious drawbacks. First more semiconductor material is required, so that the material cost is higher. Secondly, the collection of all the electron hole pairs generated in a solar cell made from a thick layer of semiconductor requires that the carrier recombination lifetime be higher, and hence the electronic quality of the semiconductor be better than when the semiconductor material is thin.

Light trapping has been proposed in the past as a solution to this problem for self-supporting wafer-type solar cells and photodetectors. Namely by causing weakly absorbed light to make many passes through the semiconductor by special surface structuring, the absorption of light near the absorption threshold can be increased with no increase in material thickness. In one approach, Redfield, U.S. Pat. No. 3,973,994, the back surface of the semiconductor is faceted with a sawtooth pattern and coated with a reflector so that light incident through the front surface is reflected from the back surface at an oblique angle with a long pathlength inside the material. In another approach, St. John, U.S. Pat. No. 3,487,223, the back surface of a silicon wafer is roughened by sandblasting. Here light that is transmitted through the smooth front surface of the wafer is scattered into a range of solid angles when it hits the rough back surface of the wafer. The scattered light has a low probability of escape because of the small escape cone for light in a high index material immersed in a low index media such as air.

In the present invention, light is trapped in semiconductors, deposited by the techniques of thin film deposition. In this invention the semiconductor material is deposited on a roughened substrate whose surface texture, can be substantially larger than the thickness of the semiconductor film. As a result of the substrate texture light is trapped inside the film by scattering, probably at both surfaces of the film and by subsequent total internal reflection. In a thin film material with a relatively high index of refraction, such as hydrogenated amorphous silicon, the light trapping effect can increase the absorption of weakly absorbed light by more than an order of magnitude.

SUMMARY OF THE INVENTION

The present invention is a thin film semiconductor device with enhanced optical absorption properties and a method for producing it. The device comprises a substrate having at least one sandblasted surface and a thin film of semiconductor material deposited on the sandblasted surface.

DESCRIPTION OF THE PREFERRED EMBODIMENT

The present invention is a thin-film semiconductor device produced by a method so as to enhance the optical absorption in the semiconductor by light trapping.

Figure 1:
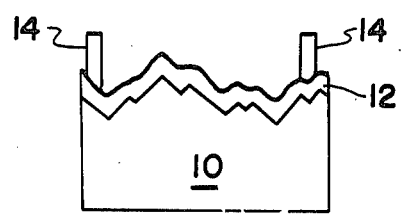
FIG. 1 is a schematic diagram of an embodiment of the present invention wherein the semiconductor device is a photoconductor.

The semiconductor device may be either a photovoltaic device such as a solar cell, or a photoconductive device such a a vidicon target, photoconductive detector or xerographic photoreceptor. FIG. 1 shows one embodiment of the improved light absorption principle, in the form of a photoconductive detector. In FIG. 1, one surface of the insulating substrate 10 is sandblasted, on which is deposited a thin film (0.1-20 $\mu$m thick) of a photoconductive semiconductor material 12. Ohmic electrical contacts 14 are deposited on top of the semiconductor by deposition of a suitably doped semiconductor material, followed by a metal film through a shadow mask. The electroded structure can be used as a photodetector by applying a voltage between the two electrodes on the front surface of the film, by means of a constant voltage power supply in series with a suitable resistor. Light absorbed in the semiconductor increases its conductivity and changes the voltage drop across the external resistor. These changes can be measured by conventional techniques and can be used to detect the presence of incident radiation and determine its intensity.

Suitable substrates include dielectrics, such as glass, fused-quartz, and sapphire. The substrate is roughened on one side with a jet of abrasive particles from an abrading unit such as the machines commonly referred to as sandblasters. The substrate is subjected to the jet of abrasive particles until the surface has a matte finish, that is, a surface finish which has no visible "shine" when viewed in reflection. Incomplete roughening of the surface will leave some areas of the substrate with the original smooth surface finish which will show up as a specular component to the reflectivity of the surface of the substrate. Continued sandblasting will simply wear away the substrate and not improve the quality of the roughened surface.

The size of the grit used to roughen the surface is not critical, within some limits. First, in order for the surface to appear rough to the eye, that is, for it to scatter light, the grit size must be larger than an optical wavelength, greater than about 1 μm. Grits in the 1–5 μm range have the disadvantage of being inefficient in the sense that the roughening process is more time consuming than with larger grits. Relatively large grits (greater than about 100 μm) roughen the surface rapidly but have a potential disadvantage in that the surface morphology can develop correspondingly large scale structures that could have detrimental effects in certain applications.

The grit particles should be composed of some hard material, such as SiC, for example. For a commercially available pencil-type sandblasting unit with 50 μm SiC grit particles, one square centimeter of quartz substrate can be suitably roughened in less than 1 minute.

The semiconductor may be any material that may be deposited by a non-directional vapor deposition technique. Suitable techniques include sputtering, plasma deposition and chemical vapor deposition. The film deposition is normally best carried out at elevated temperature, on a temperature controlled substrate in order to optimize the electronic quality of the material by allowing the defects to anneal. Semiconductor materials that can be deposited by these techniques include amorphous hydrogenated silicon, amorphous hydrogenated germanium, and amorphous Si—C alloys. Virtually any semiconductor material, either amorphous or crystalline, can be deposited in the form of a thin film by at least one of these deposition techniques.

Figure 2:
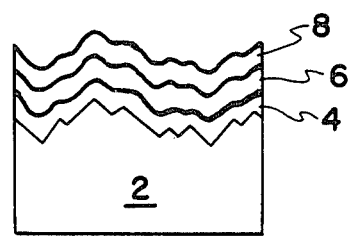
FIG. 2 is a schematic diagram of an alternate embodiment of the present invention wherein the semiconductor device is a photovoltaic device.

A photovoltaic device that utilizes the beneficial light absorption properties of a thin film semiconductor deposited on a sandblasted substrate is shown in FIG. 2. The photovoltaic cell structure includes in addition to the supportive substrate 2 a layer about 500 Å thick of a transparent conductor layer 4 such as ITO, $SnO_2$ or $CdSnO_4$, deposited on the substrate, which acts as an electrical contact to the back surface. The semiconductor material 6 in the preferred embodiment of the solar cell is deposited in three successive layers by one of the vapor deposition techniques mentioned above, in order to fabricate the pin junction structure, of p-doped, undoped and n-doped material. Techniques for plasma deposition of thin film pin solar cell structures are well-known in the art of making hydrogenated amorphous silicon solar cells for example. Finally, an anti-reflection, transparent conductive coating 8 such as ITO or $SnO_2$ is deposited on top. The structure is exposed to light from the top. Although the anti-reflection coating reduces the reflectivity of the front surface to incident light from the outside, it does not change the critical angle for trapped light on the inside of the film, and hence should have at most a minor effect on the light trapping properties of the structure.

Other device configurations such as pn junction structures or heterojunction structures well-known in the art, may also be used in a photovoltaic device, provided that the semiconductor layer has a relatively high index of refraction and that the contact layers in the structures absorb less than about 5% of the light in each pass.

EXAMPLE OF ENHANCED ABSORPTION

A 1.4 μm thick hydrogenated amorphous silicon film was deposited on a fused quartz substrate, one half of the top surface of which had been sandblasted with a 50 μm SiC grit by an S.S. White-Pennwalt abrading unit.

Figure 3:
FIG. 3 is an SEM micrograph showing the morphology of the thin film semiconductor material according to the present invention.

The hydrogenated amorphous silicon film was deposited by rf (13.5 Mhz) glow discharge decomposition of $SiH_4$, at a pressure of 150 MT and flow rate of 100 sccm. The substrate was held at 240° C. on the anode of a capacitive reactor with 6" diameter electrodes separated by 1". The rf power in the discharge was 10 W. These conditions are known to give good electronic quality material. The morphology of the film on the rough half of the substrate surface is illustrated by the scanning electron microscope micrograph in FIG. 3. Note the presence of structure in this figure on a scale up to 100 μm, more than 50× larger than the film thickness.

The optical absorption of the film was determined from photoconductivity measurements as follows. First, ohmic contacts were made to both the smooth and rough areas of the film with 8 mm long, 0.1 mm wide fingers separated by 1 mm, deposited on the top surface of the film. The electrodes consisted of 500 Å of Cr deposited on 500 Å of 1% P doped hydrogenated amorphous silicon deposited from a glow discharge in a 1% $PH_3$ in $SiH_4$ gas mixture through a shadow mask of the finger pattern. The phosphorous doped material makes an ohmic contact between the predeposited undoped material, and the Cr metal electrodes deposited on top of the phosphorous doped material through the same mask. The spectral dependence of the photoconductivity was then measured on both parts of the film with a 400 V d.c. bias and a 1M Ω series resistor as a current sensor. In order to eliminate complications arising from the interplay between the non-linear intensity dependence of the photoconductivity and the wavelength dependence of the intensity of the monochromatic probe beam, all the measurements were made with a constant bias illumination from a microscope light with a red filter. The monochromatic light was chopped at 7 hz and the response of the sample was monitored with a lock-in amplifier. The bias intensity was adjusted so that the photoconductivity signal due to the chopped monochromatic light was at most 10% of the total d.c. photoconductivity. This procedure eliminates the need for corrections to the photoconductivity data, arising from the non-linear dependence of the magnitude and response time of the photoconductive signal on light intensity. Finally, the substrate was placed on a piece of flat-black paper, so that no transmitted light was reflected back into the sample, either on the rough half or the smooth half of the substrate.

Figure 4:
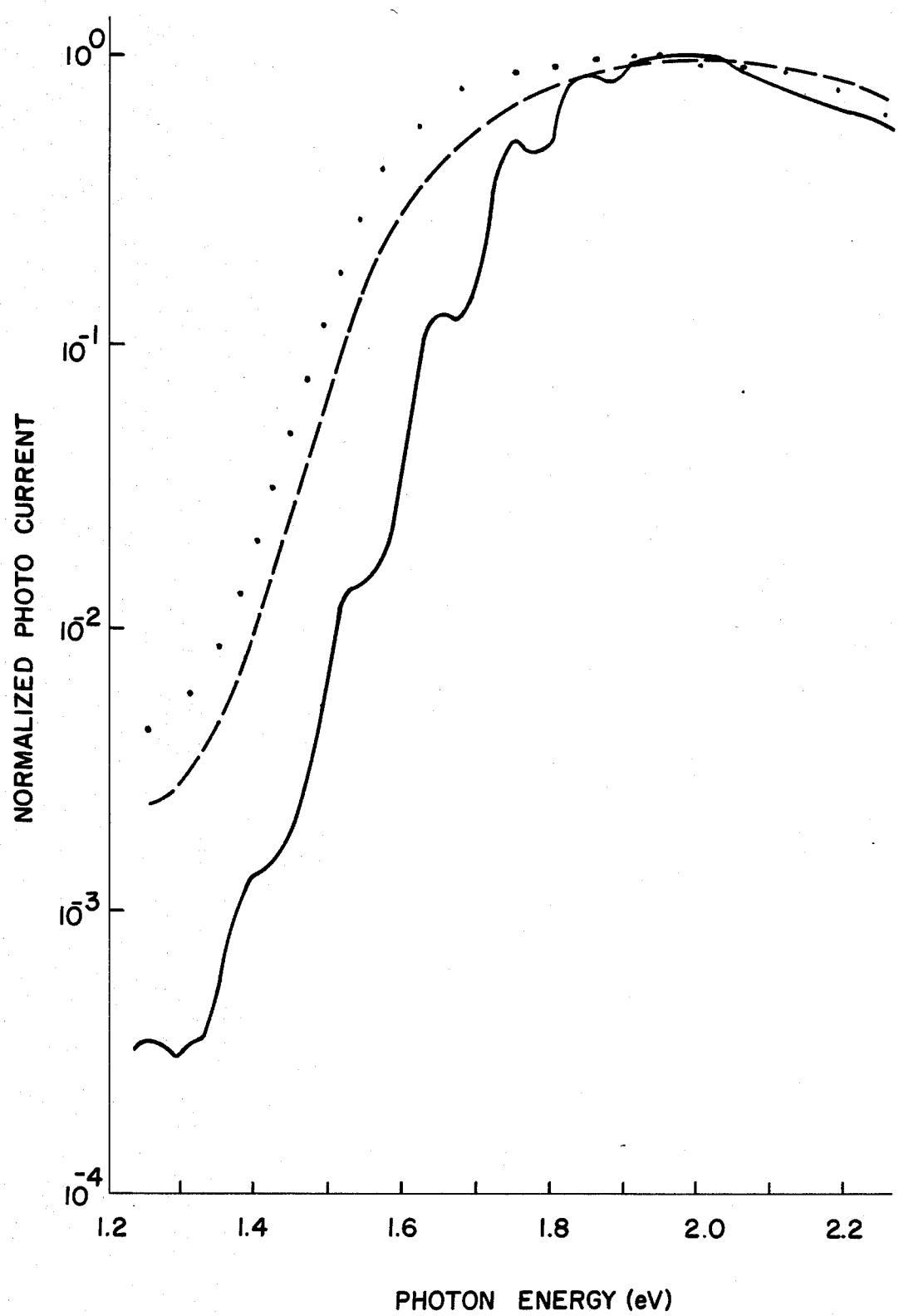
FIG. 4 is a graph showing the photocurrent as a function of the photon energy for a photoconductor constructed according to the present invention.

The wavelength dependence of the photoconductivity produced by the chopped monochromatic light is shown in FIG. 4 for the smooth (continuous line) and rough (broken line) parts of the sample. The data in FIG. 4 is the photoconductivity signal measured on the lock-in amplifier normalized to the incident photon flux and normalized to unity at 2 ev. Note that the photoconductivity shows fringes for the smooth substrate and no fringes with the rough substrate. The absence of fringes indicates that light scattering is taking place in the film on the rough substrate.

Although the photoconductivities for the rough and smooth parts of the film in FIG. 4 have been scaled so that they match at 2.0 ev, the actual measured values of the photoconductivities for the two parts of the film at this photon energy differed by only about 10%. Because of the dramatic difference in the surface morphologies, there is no reason to expect the photoconductivities to be the same, even though the measured total (diffuse) reflectivity of the rough film (31% at 1.8 ev) is very close to the specular reflectivity of the smooth film.

Note that the rough substrate in this example increases the photoconductivity of the semiconductor at long wavelengths (low photon energies) by more than an order of magnitude above the value for the same film deposited on a smooth substrate. In the weakly absorbing part of the absorption spectrum, the photoconductive signal is directly proportional to the optical absorption of the film for the measurement conditions utilizing bias light as described above. This proportionality is well-known in the art. Thus, the increase in photoconductive response at long wavelengths implies a corresponding increase in optical absorption. The increase in optical absorption at long wavelengths illustrated in FIG. 4 may be regarded as equivalent to a 0.12 ev shift in the optical absorption threshold towards lower energies.

Another factor of two increase in absorption at long wavelengths can be obtained with a reflective back surface on the substrate, in place of the flat black paper. The result of coating the back surface and edges of the substrate with Kodak MgO highly reflective white paint is indicated by the dotted curve in FIG. 4.

What is claimed is:

1. A method for producing a thin film semiconductor device with enhanced absorption properties comprising:
   (a) sandblasting one surface of a dielectric substrate such that it randomly scatters incident light, wherein said sandblasted surface includes structures up to 100 μm; and
   (b) depositing a thin film of semiconductor material on said dielectric sandblasted surface of said substrate, such that said structure is more than 50 times larger than the film thickness.

2. The method of claim 1 wherein said semiconductor depositing step is performed by glow discharge.

3. The method of claim 1 wherein said depositing step is performed by sputtering.

4. The method of claim 1 wherein said depositing step is performed by chemical vapor deposition.

5. The method of claim 1 further comprising the step of coating the surface of said substrate opposite said sandblasted surface with reflective white material.

6. A thin film semiconductor device comprising:
   (a) A dielectric substrate having at least one sandblasted surface which randomly scatters incident light, wherein said sandblasted surface includes structures up to 100 μm;
   (b) A thin film of semiconductor material deposited on said dielectric sandblasted surface, such that said structure is more than 50 times larger than said film thickness; and
   (c) at least one ohmic electrical contact to said semiconductor thin film.

7. A thin film semiconductor device as in claim 6, wherein said semiconductor material is an amorphous semiconductor.

8. The thin film semiconductor device of claim 7 wherein said semiconductor material is amorphous silicon.

9. The semiconductor device of claim 6 wherein said device is a photoconductor further comprising electrode means.

10. The semiconductor device of claim 6 wherein the surface of said substrate opposite said sandblasted surface is coated with reflective white material.

11. A photovoltaic device comprising:
    (a) a dielectric substrate having at least one sandblasted surface,
    (b) a thin film of a transparent conductor deposited on said sandblasted surface, wherein said sandblasted surface includes structures up to 100 μm,
    (c) a thin film of semiconductor material including at least one junction therein deposited on said transparent conductor, such that said structure is more than 50 times larger than said film thickness,
    (d) a layer of anti-reflective transparent conductive material deposited on said semiconductor material.

* * * * *